US012787369B2

United States Patent

(12) United States Patent
De Coi et al.

(10) Patent No.: US 12,787,369 B2
(45) Date of Patent: Nov. 3, 2026

(54) CHARGE TRANSFER DEVICE HAVING A TAPER AT THE GATE FOR CLOCK FREQUENCIES FROM 100 MHz

(71) Applicant: ESPROS Photonics AG, Sargans (CH)

(72) Inventors: Beat De Coi, Maienfeld (CH); Chongqi Yu, Bad Ragaz (CH)

(73) Assignee: ESPROS Photonics AG, Sargans (CH)

( * ) Notice: Subject to any disclaimer, the term of this patent is extended or adjusted under 35 U.S.C. 154(b) by 358 days.

(21) Appl. No.: 18/293,650

(22) PCT Filed: Jul. 29, 2022

(86) PCT No.: PCT/EP2022/071383
§ 371 (c)(1),
(2) Date: Jan. 30, 2024

(87) PCT Pub. No.: WO2023/012068
PCT Pub. Date: Feb. 9, 2023

(65) Prior Publication Data

US 2024/0339528 A1 Oct. 10, 2024

(30) Foreign Application Priority Data

Aug. 2, 2021 (EP) .................................... 21189014

(51) Int. Cl.
*H10D 44/45* (2025.01)

(52) U.S. Cl.
CPC ......... *H10D 44/466* (2025.01); *H10D 44/452* (2025.01)

(58) Field of Classification Search
CPC .. H10D 44/466; H10D 44/452; H10F 39/151; H01L 27/14812; H01L 29/7685; H01L 29/76808
See application file for complete search history.

(56) References Cited

U.S. PATENT DOCUMENTS 4,612,580 A 9/1986 Weimer
2003/0146471 A1* 8/2003 Tanaka .................... H10F 39/80 257/E21.457
(Continued)

FOREIGN PATENT DOCUMENTS

EP 0872897 A2 10/1998

OTHER PUBLICATIONS

Search Report Written Opinion for PCT Application No. PCT/EP2022/071383, dated Oct. 21, 2022, 14 pages.
(Continued)

*Primary Examiner* — Earl N Taylor
(74) *Attorney, Agent, or Firm* — Christopher J. Volkmann; KELLY, HOLT & CHRISTENSON PLLC

(57) ABSTRACT

A charge transfer device having a charge transfer channel in a semiconductor substrate. A doped conduction layer is provided for movably accepting the charge carriers, and a sequence of at least two electrically isolated gates which adjacently succeed one another for transferring the charge carriers in the conduction layer in a flow direction is provided. The charge transfer channel is formed by overlap of the possible electrostatic effect of the gates with the conduction layer. A clock generator has a clock frequency of more than 100 MHz which applies changes in potential at the clock frequency to the gates, for transporting charge carriers at the clock frequency from adjacent regions of the overlap between adjacent gates and the conduction layer. The charge transfer channel in the region of one gate has a region of a constriction in which the cross-section in the flow direction decreases, and has a region with a constant or widened cross-section.

11 Claims, 2 Drawing Sheets

(56) References Cited

U.S. PATENT DOCUMENTS

| | | | | |
|---|---|---|---|---|
| 2005/0280044 | A1* | 12/2005 | Bosiers | H10F 39/151 257/E27.152 |
| 2006/0163620 | A1 | 7/2006 | Ogo | |
| 2006/0221219 | A1* | 10/2006 | Yamada | H10F 39/151 257/E27.152 |
| 2019/0253652 | A1 | 8/2019 | Chuang et al. | |
| 2024/0339529 | A1* | 10/2024 | De Coi | H10F 39/151 |
| 2025/0119137 | A1* | 4/2025 | De Coi | H03K 17/56 |

OTHER PUBLICATIONS

Search Report for European Paten Application No. 21189014.0, dated Jan. 13, 2022, 9 pages.

International Preliminary Report on Patentability for PCT Application No. PCT/ep2022/071383. dated Feb. 6, 2024, 8 pages.

* cited by examiner

CHARGE TRANSFER DEVICE HAVING A TAPER AT THE GATE FOR CLOCK FREQUENCIES FROM 100 MHz

CROSS-REFERENCES TO RELATED APPLICATIONS

This Application is a Section 371 National Stage Application of International Application No. PCT/EP2022/071383, filed Jul. 29, 2022, and published as WO 2023/012068 A1 on Feb. 9, 2023, and claims priority to European Application No. 21189014.0 filed Aug. 2, 2021; the contents of these applications are hereby incorporated by reference in their entirety.

BRIEF DESCRIPTION OF THE DRAWINGS

Exemplary embodiments are illustrated in the drawings and are explained in greater detail below. In this case, identical reference signs in the individual figures designate elements which correspond to one another.

DETAILED DESCRIPTION

Figure 1:
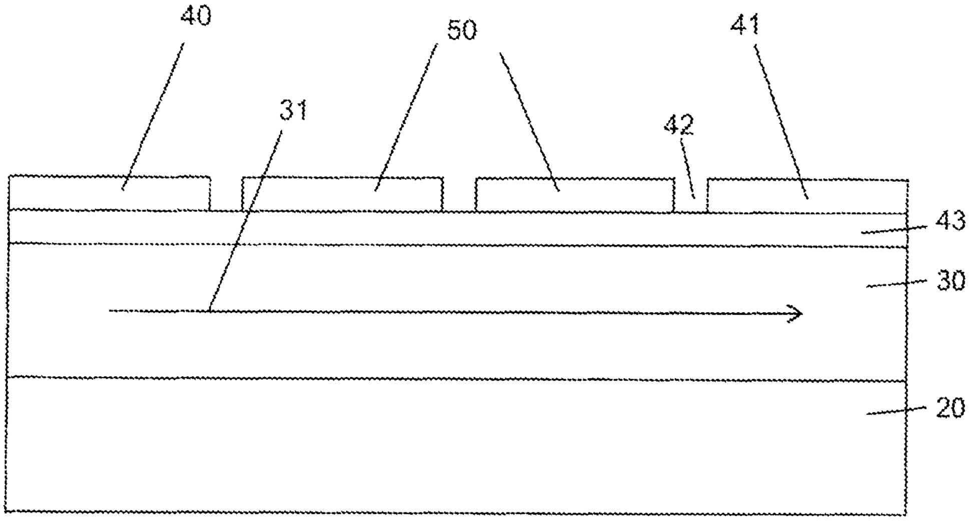
FIG. 1 shows a conduction transfer channel in side view along flow direction.

The present disclosure relates to a semiconductor structure having a charge transfer channel for clock frequencies in the range starting from 100 MHz, preferably from 250 MHz, particularly preferably up to 400 MHz.

At clock frequencies of more than 100 MHz, especially more than 250 MHz and in particular up to 400 MHz, losses may increasingly occur when transporting the charge carriers through a charge transfer channel.

It is an object of the present disclosure to provide improved charge transfer at clock frequencies of more than 100 MHz, preferably starting from 250 MHz, particularly preferably up to 400 MHz.

Proceeding from a semiconductor structure of the type mentioned in the introduction, the object is achieved by means of features described herein. Advantageous embodiments and developments of the present disclosure are possible by virtue of the measures mentioned herein.

The charge transfer device according to the present disclosure uses a charge carrier channel, inter alia. A charge transfer channel can be an overlap of the possible electrostatic effect of mutually adjoining gates with a conduction layer in a semiconductor. The charge transfer channel can thus be the intersection volume from the projection of the electrostatic effect of the gates onto the volume structure of the conduction layer.

The conduction layer, in which the charge carrier transport or charge carrier transfer takes place, can be situated in a semiconductor substrate and can be doped differently than the surrounding semiconductor substrate, with the result that charge carriers can move in the conduction layer and do not escape into the surrounding semiconductor substrate. A conduction layer can be buried or situated on the surface of the semiconductor substrate.

The gates can be electrodes which are arranged along the conduction layer and are separated from the conduction layer by a thin, nonconducting separating layer, with the result that a change in potential at the gates takes effect as a change in the electric field in the overlappingly assigned region of the conduction layer. The gates can be situated on the semiconductor substrate in a manner insulated by a thin separating layer.

Charge carriers can be electrons or holes.

Corresponding changes in potential at adjoining gates enable charge carriers to be transported in the charge transfer channel, with the result that the charge transfer channel can act as a conduction channel for a directional flow of charge carriers. The change in potential generally follows a clock frequency. The changes in potential can follow a clock frequency in this case. The clock frequency determines the rate of charge transport and thus the temporal resolution and performance of surrounding or connected systems such as sensors or computing units, for instance.

The boundaries, shape and course of the gates, the conduction layer and the charge transfer channel are always specified from the gates in the direction of the conduction layer in plan view, unless stated otherwise in an individual case. The course of the charge transfer channel and spatial relations are always specified in the direction of the charge carrier flow in the charge transfer channel, unless stated otherwise in an individual case.

If the width of the course of the juxtaposed gates is narrower than the width of the course of the assigned conduction layer, then the boundaries of the width of the course of the charge transfer channel are given by the boundaries of the course of the width of the juxtaposed gates. If the width of the course of the juxtaposed gates is wider than the width of the course of the assigned conduction layer, then the boundaries of the width of the course of the charge transfer channel are given by the boundaries of the course of the width of the assigned conduction layer.

It has been recognized in connection with the present disclosure that at relatively high clock frequencies starting from 100 MHz or 250 MHz, some of the charge carriers situated below a gate, in the event of a corresponding change in potential, often do not cross to the next gate as desired; advantageously, this effect can be reduced or avoided by means of the charge transfer device according to one example.

The charge transfer device according to one example is a charge transfer device having a charge transfer channel in a semiconductor substrate having a doped conduction layer for movably accepting the charge carriers, having a sequence of at least two electrically isolated gates which adjacently succeed one another for transferring the charge carriers in the conduction layer in a flow direction, wherein the charge transfer channel is formed by overlap of the possible electrostatic effect of the gates with the conduction layer, and having a clock generator having a clock frequency of more than 100 MHz, in particular more than 150 MHz, more than 200 MHz or approximately or more than 250 MHz and in particular up to 300 MHz or 400 MHz, which applies changes in potential at the clock frequency to the gates, for transporting charge carriers at the clock frequency from adjacent regions of the overlap between adjacent gates and the conduction layer, wherein this structure corresponds to a CCD structure, wherein the charge transfer channel in the region of one gate and in particular one gate has a region of a constriction in which the cross-section in the flow direction decreases, and in particular decreases continuously, in particular in a constant fashion, and has a region with a constant or widened cross-section which adjoins the region of the constriction upstream of the region of the constriction in the flow direction, and has a region with a constant or widened cross-section which adjoins the region of the constriction downstream of the region of the constriction in the flow direction.

This charge transfer channel according to one example can afford the advantage that charge carriers can flow with less resistance and/or fewer losses.

Preferably, the region of the constriction is arranged in a manner displaced from the center of the gate counter to the flow direction. It has been found, surprisingly, that the losses can be reduced again by this arrangement.

Preferably, the region of the constriction is embodied as beveled at least on one side.

Preferably, the region of the constriction is embodied as funnel-shaped.

Preferably, for a given decrease in the cross-section of the conduction channel in the region of a gate or for a given decrease in the cross-section of a gate on account of the arrangement of the 3 regions, the spillback or the flow resistance or the loss of the charge carriers in the flow direction decreases.

Preferably, the semiconductor substrate is p+ doped. Preferably, the conduction layer is weakly n− doped in order to promote the charge carrier flow. Preferably, the gates are formed from metal in order to increase the force field generated. Preferably, a nonconducting layer is arranged between the gates and the conduction layer, whereby the loss of charge carriers can also be reduced. Preferably, the gates are separated in a manner electrically insulated from one another in order to promote the portionwise transport from gate to gate.

FIG. 1 shows a charge transfer channel 10 in side view along the flow direction 31 of the charge carriers. The construction is analogous to CCD technology. The surrounding semiconductor substrate 20 is p+ doped. A buried conduction layer 30 is arranged in the semiconductor substrate 20. The conduction layer is weakly n− doped. This has the consequence that electrons as charge carriers are freely mobile in the conduction layer and do not penetrate into the semiconductor substrate. An insulation layer 43 is applied on the conduction layer and gates 40, 41, 50 composed of metal are arranged on said insulation layer. The gates are electrically isolated from one another by interspaces. The clock generator (not illustrated) applies a positive potential at a clock frequency of 250 MHz alternately to the adjacent gates, with the result that conduction electrons in the conduction layer are attracted from one gate to the next and are thus transferred in the flow direction. The clock frequency could also be only more than 100 MHz, more than 150 MHz or more than 200 MHz. In general, the clock frequency is not higher than 400 MHz. The conduction electrons can be for example photoinduced electrons from an image sensor connected to the conduction channel.

The semiconductor substrate 20 is p+ doped and the conduction layer 30 is n− doped. The insulation layer 43 is composed of $SiO_2$ and the gates are formed from metal.

Figure 2:
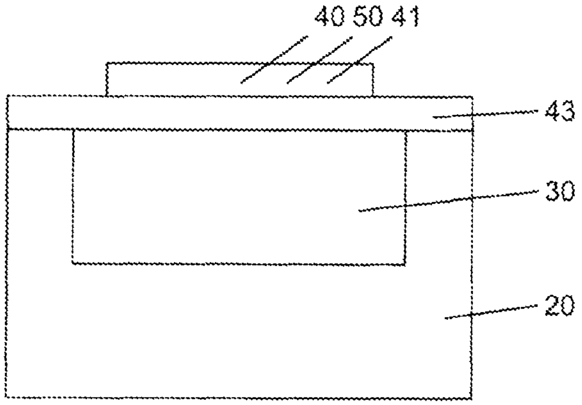
FIG. 2 shows a conduction transfer channel in side view perpendicular to flow direction.

FIG. 2 shows the charge transfer channel in side view perpendicular to the flow direction of the charge carriers. The conduction layer 30 is buried, and so it is encompassed from above and laterally by the semiconductor substrate 20. Semiconductor substrate 20 and conduction layer 30 are provided with an insulation layer toward the top. The gates 40, 41, 50 are arranged on the insulation layer 43 in the region above the conduction layer 30. The gates are embodied as narrower than the conduction layer in the width extent along the flow direction.

Figure 3:
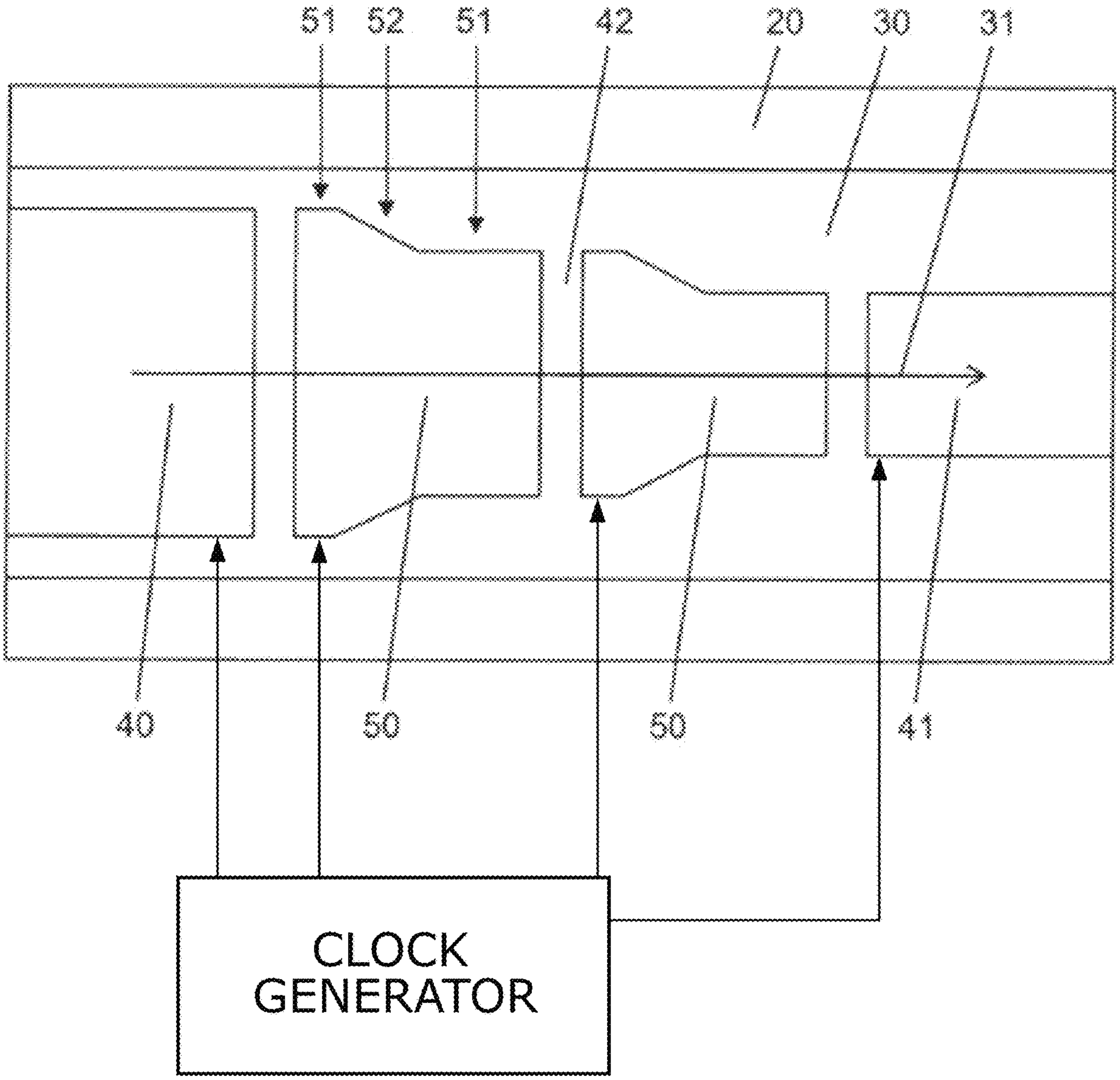
FIG. 3 shows a conduction transfer channel with constriction in plan view.

FIG. 3 shows the charge transfer channel in plan view. The conduction layer 30 is embedded in the semiconductor substrate 20. The overlying insulation layer is not shown. Above the region of the conduction layer 30, in a manner separated by the insulation layer (not shown), the gates 40, 50, 41 are arranged in an electrically isolated manner in flow direction 31 of the electrons and with spacings 42. Overall, the gates exhibit a constriction of the cross-section in the flow direction. The first gate 40 has a wide cross-section, while the last gate 41 has a comparatively narrower cross-section. The two gates 50 have a narrowing cross-section in flow direction 31. The narrowing gate 50 has, in flow direction 31, firstly a wide region with constant cross-section without constriction 51, then a cross-sectionally narrowing region with constriction 52 and thereupon a narrower region with once again constant cross-section without constriction 51. In this case, the gate 50 has regions with constant cross-section at the transition to the adjacent gates. The region arranged counter to the flow direction with constant cross-section without constriction is shorter than the region arranged in the flow direction with constant cross-section without constriction. As a result, the narrowing region with constriction 52 is arranged in a manner displaced from the center of the gate 50 counter to the direction of the flow direction. The narrowing region with constriction 52 is embodied as beveled on both sides, with the result that it has a funnel-shaped shape. The embodiment of a constriction thus shown makes it possible to minimize the spillback and/or the flow resistance and/or the losses of the charge carriers in the flow direction.

Although the present invention has been described with reference to preferred embodiments, workers skilled in the art will recognize that changes may be made in form and detail without departing from the spirit and scope of the invention.

LIST OF REFERENCE SIGNS

10 Charge transfer channel
20 Semiconductor substrate
30 Conduction layer
31 Flow direction
40 Gate, wide
41 Gate, narrow
42 Insulating spacing between the gates
43 Insulation layer
50 Gate with constriction
51 Region without constriction
52 Region with constriction

The invention claimed is:

1. A charge transfer device comprising:

a charge transfer channel in a semiconductor substrate, the charge transfer channel having:

a doped conduction layer for movably accepting charge carriers, and a sequence of at least two electrically isolated gates which adjacently succeed one another for transferring the charge carriers in the doped conduction layer in a flow direction defined by the sequence of the at least two electrically isolated gates and the doped conduction layer, wherein the at least two electrically isolated gates overlap with the doped conduction layer; and a clock generator having a clock frequency of more than 100 MHz, wherein the clock generator applies changes in potential at the clock frequency to the at least two electrically isolated gates for transporting the charge carriers at the clock frequency in the flow direction;

wherein the charge transfer channel, in a region defined by one gate, of the at least two electrically isolated gates, has:

a region of a constriction with a width that decreases continuously in a constant fashion in the flow direction, a first region with a constant width that is upstream of the region of the constriction relative to the flow direction, wherein the first region with the constant width adjoins to the region of the constriction, and a second region with a constant width that is downstream of the region of the constriction relative to the flow direction, wherein the second region with the constant width adjoins to the region of the constriction, and wherein the second region is more narrow than the first region.

2. The charge transfer device as claimed in claim 1, wherein the region of the constriction is displaced from a center of the region defined by the one gate, of the at least two electrically isolated gates, counter to the flow direction.

3. The charge transfer device as claimed in claim 1, wherein the region of the constriction is beveled on at least on one side of the region of the constriction.

4. The charge transfer device as claimed in claim 1, wherein the region of the constriction is funnel-shaped.

5. The charge transfer device as claimed in claim 1, wherein the region of the constriction is configured to reduce a loss of the charge carriers as the width of the region of the constriction decreases continuously in the constant fashion in the flow direction.

6. The charge transfer device as claimed in claim 1, wherein:

the semiconductor substrate is p+ doped, and/or the doped conduction layer is weakly n− doped, and/or the gates are formed from metal, and/or a nonconducting layer is arranged between the at least two electrically isolated gates and the doped conduction layer and/or each gate, of the at least two electrically isolated gates, is separated in a manner electrically insulated from one another.

7. The charge transfer device as claimed in claim 1, wherein the clock frequency is more than 150 MHz.

8. The charge transfer device as claimed in claim 7, wherein the clock frequency is more than 200 MHz.

9. The charge transfer device as claimed in claim 8, wherein the clock frequency is more than 250 MHz.

10. The charge transfer device as claimed in claim 9, wherein the clock frequency is more than 300 MHz.

11. The charge transfer device as claimed in claim 10, wherein the clock frequency is more than 400 MHz.

* * * * *